United States Patent
Armbruster et al.

(10) Patent No.: US 10,431,474 B2
(45) Date of Patent: Oct. 1, 2019

(54) METHOD FOR FORMING A CAVITY AND A COMPONENT HAVING A CAVITY

(71) Applicant: Robert Bosch GmbH, Stuttgart (DE)

(72) Inventors: Simon Armbruster, Wannweil (DE); Benjamin Steuer, Waldenbuch (DE); Stefan Pinter, Reutlingen (DE); Dietmar Haberer, Reutlingen (DE); Jochen Tomaschko, Herrenberg (DE)

(73) Assignee: Robert Bosch GmbH, Stuttgart (DE)

( * ) Notice: Subject to any disclaimer, the term of this patent is extended or adjusted under 35 U.S.C. 154(b) by 386 days.

(21) Appl. No.: 15/318,702

(22) PCT Filed: May 29, 2015

(86) PCT No.: PCT/EP2015/061969
§ 371 (c)(1),
(2) Date: Dec. 14, 2016

(87) PCT Pub. No.: WO2015/193081
PCT Pub. Date: Dec. 23, 2015

(65) Prior Publication Data
US 2017/0140943 A1    May 18, 2017

(30) Foreign Application Priority Data
Jun. 17, 2014 (DE) .......................... 10 2014 211 555

(51) Int. Cl.
*H01L 21/30* (2006.01)
*H01L 21/48* (2006.01)
(Continued)

(52) U.S. Cl.
CPC ............ *H01L 21/4803* (2013.01); *B81B 1/00* (2013.01); *B81C 1/0042* (2013.01);
(Continued)

(58) Field of Classification Search
None
See application file for complete search history.

(56) References Cited

U.S. PATENT DOCUMENTS 3,765,969 A    10/1973  Kragness et al.
5,479,426 A    12/1995  Nakanishi et al.
(Continued)

OTHER PUBLICATIONS

Oosterbroek, et al. "Etching Methodologies in {111}—Oriented Silicon Wafers", J. of Microelectromechanical Sustems, vol. 9, No. 3 (2009), pp. 390-398.
(Continued)

*Primary Examiner* — Evren Seven
(74) *Attorney, Agent, or Firm* — Norton Rose Fulbright US LLP; Gerard Messina

(57) ABSTRACT

A method for forming a cavity in a silicon substrate, a surface of the silicon substrate having a tilting angle relative to a first plane of the silicon substrate, and the first plane being a {111} plane of the silicon substrate, and situation of an etching mask on the surface of the silicon substrate. The etching mask has a retarding structure that protrudes into the mask opening, and a first etching projection region. All further edges of the mask opening outside the first etching projection region are situated essentially parallel to {111} planes of the silicon substrate. The method includes an anisotropic etching of the silicon substrate during a defined etching duration. An etching rate in the <111> directions of the silicon substrate is lower than in other spatial directions, and the first retarding structure is undercut in a first undercut direction going out from the first etching projection region.

13 Claims, 11 Drawing Sheets

(51) Int. Cl.
*H01L 21/308* (2006.01)
*B81C 1/00* (2006.01)
*B81B 1/00* (2006.01)

(52) U.S. Cl.
CPC ...... *B81C 1/00103* (2013.01); *H01L 21/3083* (2013.01); *B81B 2203/033* (2013.01); *B81B 2203/0315* (2013.01); *B81B 2203/0384* (2013.01); *B81C 2201/013* (2013.01)

(56) References Cited

U.S. PATENT DOCUMENTS

| | | | |
|---|---|---|---|
| 2009/0279172 A1 | 11/2009 | Higashi | |
| 2011/0014794 A1 | 1/2011 | Kaelberer et al. | |
| 2017/0045475 A1* | 2/2017 | Astier | B01L 3/502707 |
| 2017/0194190 A1* | 7/2017 | Su | H01L 21/764 |
| 2017/0250265 A1* | 8/2017 | Li | H01L 29/7849 |
| 2018/0240766 A1* | 8/2018 | Obu | H01L 21/76898 |

OTHER PUBLICATIONS

Pandraud, et al. "Micromachining of 1-HIgh-Contrast Optical Waveguides in {111} Silicon Wafers", IEEE Photonics Technology Letters, vol. 12, No. 3 (2000), pp. 308-310.

Werkmeister, et al. "Anisotropic Etching of Silicon as a Tool for Creating Injection Molding Tooling Surfaces", J. of Microelectromechanical Systems, vol. 15, No. 6 (2006), pp. 1671-1680.

International Search Report dated Sep. 17, 2015, issued in the corresponding International Application PCT/EP2015/061969 filed May 29, 2015.

\* cited by examiner

METHOD FOR FORMING A CAVITY AND A COMPONENT HAVING A CAVITY

FIELD

The present invention relates to a method for forming a cavity in a silicon substrate, and to a component having a silicon substrate having a cavity.

BACKGROUND INFORMATION

For the mounting of optical elements in semiconductor components, cavities set at an angle, having an essentially rectangular contour, are used. Such cavities make it possible to tilt the bearing surface of the optical elements relative to a surface of the component. Here, the component can for example form an inclined window seat for an optical window. Angled cavities can be produced in a silicon substrate using subtractive processing methods (for example abrasively).

The article "Etching Methodologies in <111>-Oriented Silicon Wafers" (Oosterbroek et al., Journal of Microelectromechanical Systems, vol. 9, no. 3, p. 390-398, September 2000) describes a method for forming cavities in a silicon substrate. Through anisotropic etching of a substrate, cavities can be produced whose side surfaces are situated completely in {111} planes.

SUMMARY

An object of the present invention is to provide an improved method for producing cavities in a silicon substrate. This object may be achieved by a method in accordance with example embodiments of the present invention. A further object of the present invention is to provide an improved component having a silicon substrate having a cavity. This object may be achieved by a component according to example embodiments of the present invention. Developments of the present invention are described herein.

A method for forming a cavity in a silicon substrate includes, as a first step, a provision of the silicon substrate, a surface of the silicon substrate having a tilting angle relative to a first plane of the silicon substrate, and the first plane being a {111} plane of the silicon substrate. As a further step, the method includes a situation of an etching mask on the surface of the silicon substrate, the etching mask having a mask opening having a first transverse edge and a second transverse edge parallel to the first transverse edge, and the first transverse edge being situated in the first plane of the silicon substrate. Moreover, the etching mask has a first retarding structure that protrudes into the mask opening. In addition, the etching mask has a first etching projection region. All other edges of the mask opening outside the first etching projection region are situated essentially parallel to {111} planes of the silicon substrate. As a further step, the method includes an anisotropic etching of the silicon substrate during a defined etching duration. Here, an etching rate in the <111> directions of the silicon substrate is lower than in other spatial directions, and the first retarding structure is undercut, in a first undercutting direction, going out from the first etching projection region, the first undercutting direction being oriented parallel to the first transverse edge and to the second transverse edge of the mask opening. The etching duration is defined such that due to the anisotropic etching a cavity is formed in the silicon substrate that has an opening on the surface of the silicon substrate, the opening of the cavity being limited at two sides by the first transverse edge and the second transverse edge of the mask opening, and at a further side by a first longitudinal edge, parallel to the first and the second transverse edge, produced by the undercutting of the first retarding structure. Moreover, in the method the etching duration is defined such that after the elapsing of the etching duration the first plane of the silicon substrate is essentially exposed and forms a floor surface of the cavity.

This method simplifies the production of cavities having inclined side surfaces and rectangular opening edges, resulting in a savings of time and costs. Compared to mechanical processing, the forming of the cavity using anisotropic etching offers a significant improvement of the surface quality of the floor surfaces and side surfaces of the cavity, in particular a high degree of angular precision of the inclinations, low geometrical tolerances, a high degree of flatness, and low surface roughness.

In the method, there advantageously takes place no undercutting of the etching mask along the first and the second transverse edge, because the first and second transverse edge are situated in a {111} plane of the silicon substrate. In particular, advantageously an approximately right angle can arise between the first longitudinal edge and the first or second transverse edge of the cavity.

Because the etching time is dimensioned such that a floor surface of the cavity is formed by the exposed first plane, the floor surface of the cavity intersects the surface of the substrate along the first transverse edge at the tilting angle defined by the tilting of the first plane. Moreover, given an essentially complete exposure of the first plane the floor surface can advantageously be almost atomically smooth.

The forming of the cavity through an anisotropic etching is suitable for the simultaneous processing of a large number of cavities formed on the silicon substrate. The silicon substrate can for example be a complete wafer processed together with further wafers of the same type in a batch process. Anisotropic etching is compatible with other processes typically used in semiconductor technology, in particular planar processes. In comparison with a separate mechanical processing of the cavities, this results in a significant reduction in the process time and costs. Moreover, the etching is a genuinely clean-room-compatible process, so that a cleaning of the silicon substrate after the forming of the cavity, necessary in the case of a mechanical processing, is dispensed with.

In a development of the method, the etching mask has a second retarding structure that protrudes into the mask opening, and a second etching projection region. Moreover, through the anisotropic etching of the silicon substrate the second retarding structure, going out from the second etching projection region, is undercut in a second undercut direction opposite the first undercut direction in such a way that after the elapsing of the etching duration a second longitudinal edge limiting the opening of the cavity is formed that is situated parallel to the first longitudinal edge. This advantageously makes it possible to produce, through an anisotropic etching process, a cavity that has an essentially rectangular opening on the surface of the silicon substrate.

In a development of the method, the first etching projection region has an etched edge that is not situated parallel to a {111} plane of the silicon crystal. In this way, the undercutting of the retarding structure begins at the etched edge.

In a development of the method, the first retarding structure has a triangular base structure, the first longitudinal edge being formed on a first side of the triangular base structure, and a second and a third side of the triangular base structure being situated essentially parallel to {111} planes of the silicon substrate. In this way, the second and the third side of the triangular base structure are advantageously at first not undercut, and an undercutting of the retarding structure goes out from the corner point of the base structure situated opposite the first side. This advantageously simplifies the formation of the first longitudinal edge on the first side of the triangular base structure, and produces a longitudinal edge having an advantageously low degree of waviness.

In a development of the method, the first retarding structure has a first delaying structure that is situated at a first corner point of the triangular base structure opposite the first side. In this way, over the length of the first delaying structure in the undercutting direction it can be ensured that the retarding structure is undercut up to the first longitudinal edge at the earliest when the floor surface of the cavity in the first plane of the silicon substrate is completely exposed.

In a development of the method, the first delaying structure connects the first corner point of the triangular base structure to the first transverse edge and/or the second transverse edge. In this way, it can advantageously be avoided that the first delaying structure detaches from the etching mask after it has been at least partly undercut. Otherwise, at breaking edges of the attached parts of the second etching mask the undercutting process is disturbed, which results in an irregular etching progress and thus to a higher degree of waviness of the first longitudinal edge of the opening of the cavity.

In a development of the method, the etching mask has at least one reinforcing structure that connects the first retarding structure to the first transverse edge and/or to the second transverse edge. This advantageously prevents a part of the retarding structure from detaching from the mask after it has been undercut and thus stands free. In this way, an advantageously homogenous undercutting of the first retarding structure and a low degree of waviness of the produced first longitudinal edge can be achieved.

In a development of the method, the etching mask has a third etching projection region, and, going out from the first etching projection region and the third etching projection region, the first retarding structure is undercut in such a way that when the etching duration expires, the first longitudinal edge limiting the opening of the cavity is formed. In this way, irregularities that occur when there is an undercutting going out from one of the two etching projection regions affect the waviness of the resulting first longitudinal edge to an advantageously small degree.

In a development of the method, the first retarding structure has a first segment having a first oblong region and having a first pointed region, and a second segment having a second oblong region and having a second pointed region. Here, a first point of the first pointed region forms the first etching projection region and a second point of the second pointed region forms the third etching projection region. Moreover, a first side of the first oblong region is situated on the first pointed region and a first side of the second oblong region is situated on the second pointed region. Finally, the first longitudinal edge is fashioned on a second side of the first oblong region and on a second side of the second oblong region.

In this way, the first and the second oblong region can advantageously be simultaneously undercut, each going out from the first or second point. In this way, the first longitudinal edge is formed, with an advantageously low degree of waviness, on sides of the oblong regions opposite the pointed regions.

In a development, the method includes, as a further step, a creation of a through-opening between the floor surface of the cavity and a rear side, situated opposite the surface, of the silicon substrate. The floor surface of the cavity can for example be removed only partly during the creation of the through-opening. In this way, advantageously a through-opening can be produced that has an angled circumferential edge on the upper side of the silicon substrate.

In a development of the method, the method includes a formation of a further cavity on the rear side of the silicon substrate, the through-opening being made between the floor surface of the cavity and a floor surface of the further cavity. In this way, a thin membrane can be formed in the silicon substrate.

In a development of the method, the creation of the through-opening includes a formation of a first trench that extends from the floor surface of the cavity into the silicon substrate in the direction of the further cavity. It also includes a formation of a second trench that extends from the floor surface of the further cavity into the silicon substrate in the direction of the cavity. Moreover, it includes a separation of a part of the silicon substrate that is situated between the first and the second trench.

The first and the second trench can for example each form a closed curve, for example a rectangle or an ellipse. By separating the part of the silicon substrate situated between the first and the second trench, the interior of the closed curve can be removed in an advantageously simple manner, thus creating the through-opening. In particular, a technically difficult through-etching of the silicon substrate down to the floor surface of the further cavity is avoided.

In a development of the method, the method includes, as a further step, a situation of a small window plate in the cavity in such a way that the small window plate covers the through-opening and lies on an edge surface situated in the floor surface of the cavity that surrounds the through-opening. In this way, a silicon substrate having a window that is oblique relative to the surface of the silicon substrate can advantageously be produced. A perpendicular orientation of the first transverse edge and/or of the second transverse edge of the opening of the cavity relative to the first longitudinal edge of the opening simplifies a particularly precise orientation and mounting of the optical element.

A component includes a silicon substrate that has a cavity that has an essentially rectangular opening on a surface of the silicon substrate. Moreover, a floor surface of the cavity is inclined relative to the surface of the silicon substrate by a tilting angle, and is situated in a first plane of the silicon substrate. The first plane is here a {111} plane of the silicon substrate. In this way, a component is advantageously provided in which the floor surface of the cavity forms a support surface that is inclined relative to the surface. An essentially rectangular opening of the cavity makes it possible to orient elements situated on the floor surface of the cavity in an advantageously precise manner relative to the silicon substrate.

In a development of the component, the silicon substrate has a through-opening that extends between the floor surface of the cavity and a rear side of the silicon substrate, situated opposite the surface. In this way, the component is advantageously suitable as a bearer for elements situated at an angle relative to the substrate surface that are accessible both from the surface and from the floor surface of the silicon substrate.

Below, exemplary embodiments of the present invention are explained in more detail on the basis of figures.

DETAILED DESCRIPTION OF EXAMPLE EMBODIMENTS

Figure 1:
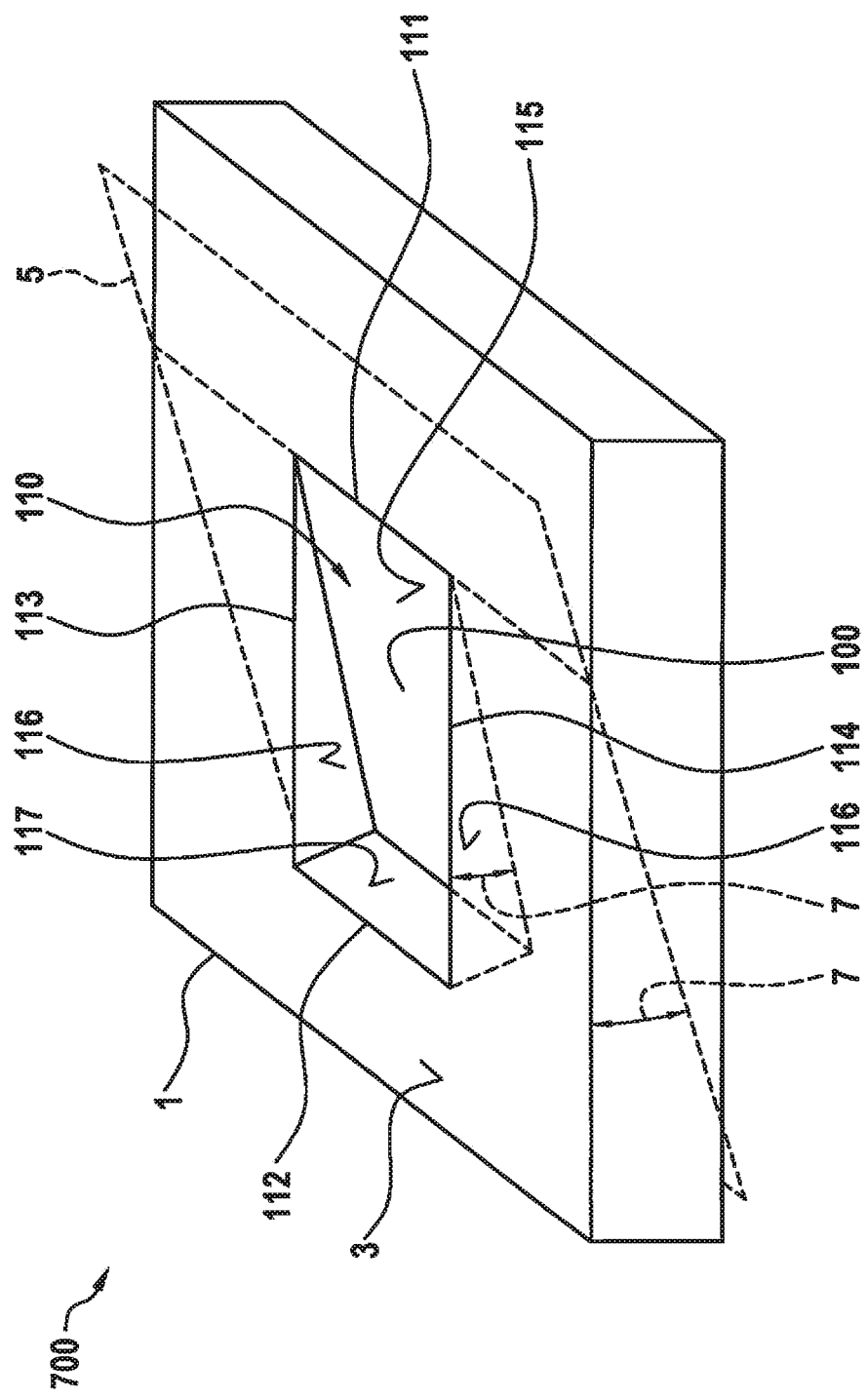
FIG. 1 shows a front view of the component having a silicon substrate having a cavity.

In the following description of the various specific embodiments, identical reference characters are used for identical elements or elements having identical function.

FIG. 1 shows a perspective view of a component 700. Component 700 includes a silicon substrate 1 in which a cavity 100 is formed. Cavity 100 has an essentially rectangular opening 110 on a surface 3 of substrate 1. Opening 110 is limited by a first transverse edge 111, a second transverse edge 112 parallel to first transverse edge 111, as well as a first longitudinal edge 113 and a second longitudinal edge 114. Longitudinal edges 113, 114 are each oriented approximately perpendicular to first and second transverse edge 111, 112. Cavity 100 has a floor surface 115 that is inclined by a tilting angle 7 relative to surface 3 of silicon substrate 1. This floor surface intersects surface 3 along first transverse edge 111, and points into silicon substrate 1. Cavity 100 is in addition limited by a further floor surface 117, situated opposite the floor surface, and two side surfaces 116.

Silicon substrate 1 can for example have monocrystalline silicon. In order to form cavity 100, silicon substrate 1 is provided in such a way that one of the {111} planes is inclined by tilting angle 7 relative to surface 3 of silicon substrate 1, and forms a first plane 5 of silicon substrate 1. This silicon substrate can be produced for example through oblique sawing. Tilting angle 7 can be for example in a range between 1° and 40°. Preferably, it is between 5° and 20°.

Cavity 100 is produced by an anisotropic wet-chemical etching of silicon substrate 1. For the anisotropic etching, an etching solution is used in which an etching rate in some crystal directions of silicon substrate 1 is lower than in other crystal directions. Given the use of an etching solution that includes KOH or TMAH, the slowly etching crystal directions are for example the <111> directions. If the etching rate in the <111> directions is lower than in other spatial directions, as is assumed in the following description, then the {111} surfaces perpendicular to the <111> direction form during the etching. This is described in the article by Oosterbroek et al.

In order to define the shape of cavity 100, before the etching an etching mask is situated on surface 3 of silicon substrate 1. Given the use of an etching solution containing KOH, the etching mask can for example contain SiO or SiN.

As is also stated in the article by Oosterbroek et al., all edges of the etching mask that are not situated in a {111} plane of silicon substrate 1 are undercut until in each case a side surface has formed in a {111} plane. Because the section lines of surface 3 of silicon substrate 1 form in general a hexagonal structure with the {111} planes of silicon substrate 1, which are tangential to a rectangular mask opening, the rectangular opening 110 of cavity 100 cannot be produced using a rectangular mask opening.

Figure 2:
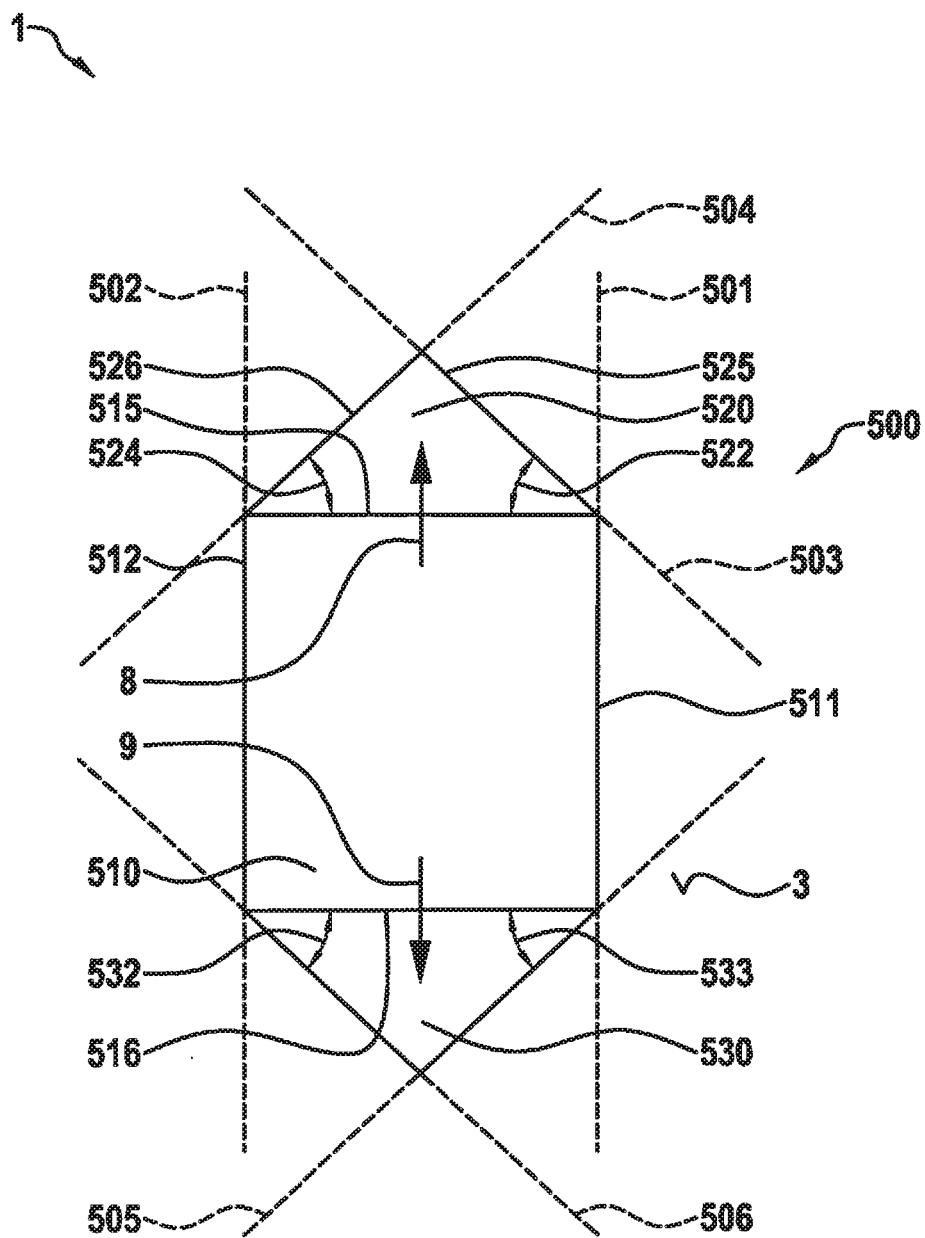
FIG. 2 shows a top view of a test mask situated on the silicon substrate.

FIG. 2 shows a schematic representation of an undercutting produced by the anisotropic etching of silicon substrate 1, on which there is situated a test mask 500 having a rectangular test mask opening 510. Here, silicon substrate 1 is identical to the silicon substrate of the specific embodiment in FIG. 1, and in particular has the small tilting angle 7 of first plane 5 relative to the surface of silicon substrate 1. Test mask 500 is oriented relative to silicon substrate 1 in such a way that a first transverse edge 511 and a second transverse edge 512 of rectangular test mask opening 510 are each situated in a first {111} plane 501 or in a second {111} plane 502 of silicon substrate 1. Overall, four additional {111} planes of silicon substrate 1 lie against test mask opening 510. A third {111} plane 503 and a fourth {111} plane 504 are adjacent to endpoints of a first longitudinal edge 515 of test mask opening 510. A fifth {111} plane 505 and a sixth {111} plane 506 are adjacent to the endpoints of a second longitudinal edge 516 of test mask opening 510.

When there is an anisotropic etching of silicon substrate 1 with test mask 500, first and second transverse edge 511, 512 of the test mask opening are not undercut, because these are situated in first {111} plane 501 or second {111} plane 502. In contrast, first longitudinal edge 515 of test mask opening 510 is undercut until third {111} plane 503 and fourth {111} plane 504 are exposed. Next to a rectangular opening in the region of test mask opening 510 there thus results a first undercut region 520 that forms, on surface 3 of silicon substrate 1, a triangular opening adjoining the rectangular opening in the region of test mask opening 510. This triangular opening is limited by first longitudinal edge 515 of test mask opening 510 and by a first undercut edge 525 and a second undercut edge 526. First undercut edge 525 and first longitudinal edge 515 enclose a first undercut angle 522, while second undercut edge 526 and first longitudinal edge 515 enclose a second undercut angle 524.

The length of first undercut edge 525 and of second undercut edge 526, and the size of first undercut angle 522 and of second undercut angle 524, are a function of the position of the {111} planes, and thus of the size of tilting angle 7 of first plane 5 relative to surface 3 of silicon substrate 1. For small tilting angle 7, the triangle that limits first undercut region 520 on surface 3 of silicon substrate 1 can be assumed to be equilateral. Thus, first undercut angle 522 and second undercut angle 524 can also be assumed to be equal in size. For a tilting angle of 8°, first undercut angle 522 and second undercut angle 524 can for example be approximately 32°.

On second longitudinal edge 516 of test mask opening 510, analogously a second undercut region 530 is formed that produces a further triangular opening in the surface of silicon substrate 1. The shape of second undercut region 530 can here correspond to a rotation of first undercut region 520 by 180°. In particular, first undercut angle 522 and a third undercut angle 532, situated diagonally opposite the first undercut angle relative to test mask opening 510, can be equal in size. Likewise, second undercut angle 524 and a fourth undercut angle 533, situated diagonally opposite the second undercut angle, can be equal in size. For small tilting angles 7, the opening of second undercut region 530 can also be assumed to be equilateral.

Figure 3:
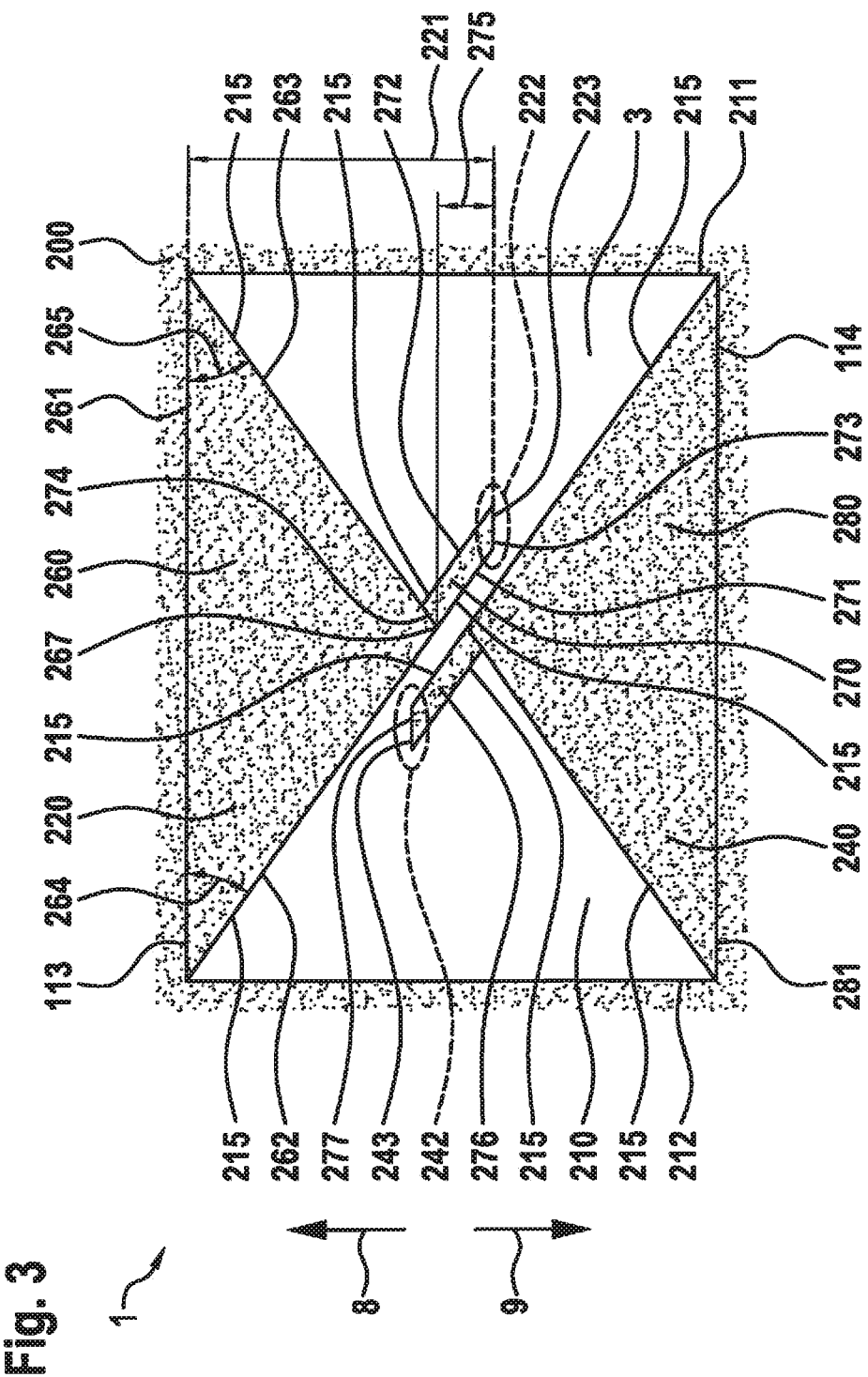
FIG. 3 shows a top view of a first etching mask situated on the silicon substrate.

FIG. 3 shows a schematic top view of a first etching mask 200 on surface 3 of silicon substrate 1, which can be used to form cavity 100 shown in FIG. 1. First etching mask 200 has a mask opening 210 that is limited by a first transverse edge 211 and a second transverse edge 212, situated opposite first transverse edge 211 and parallel thereto. First etching mask 200 further has a first retarding structure 220 and a second retarding structure 240, which each protrude into mask opening 210.

Through a targeted undercutting of first retarding structure 220 and of second retarding structure 240, cavity 100 shown in FIG. 1 can be produced in silicon substrate 1, having essentially rectangular opening 110 on surface 3 of silicon substrate 1.

First etching mask 200 is situated on surface 3 of silicon substrate 1 in such a way that first transverse edge 211 is situated in first plane 5 intersecting surface 3 at tilting angle 7. In this way, second transverse edge 212, also running parallel to first transverse edge 211, is situated in one of the {111} planes of silicon substrate 1.

First retarding structure 220 has a triangular base structure 260. A first side 261 of triangular base structure 260 connects an end of first transverse edge 211 to an end of second transverse edge 212, and is oriented at a right angle to first transverse edge 211 and to second transverse edge 212. A second side 262 and a third side 263 of the triangular base structure are situated respectively at an end of first side 261, and form, with first side 261, a respective first base angle 264 or second base angle 265. The second and the third side of base structure 260 are each situated essentially parallel to {111} planes of silicon substrate 1.

The shape of triangular base structure 260 can for example be determined by carrying out a test etching using test mask 500 shown in FIG. 2. First base angle 264 can then have the same size as first undercut angle 522 formed during the test etching of test mask 500. Analogously, second base angle 265 has the same size as second undercut angle 524 determined in the test etching. For small tilting angles 7, first base angle 264 and second base angle 265 can be assumed to be equal in size. Triangular base structure 260 then forms an equilateral triangle.

First retarding structure 220 has a trapezoidal first delaying structure 270. First delaying structure 270 is connected to triangular base structure 260, and is situated at a first corner 267, situated opposite first side 261, of triangular base structure 260. First delaying structure 270 has a first edge 271 and a second edge 272 that run parallel to second side 262 of triangular base structure 260. A third edge 273 of first delaying structure 270 stands perpendicular to first and second transverse edge 211, 212 of mask opening 210. A fourth edge 274 of first delaying structure 270 is connected to third side 263 of triangular base structure 260.

With the exception of third edge 273 of first delaying structure 270, all edges of first retarding structure 220 are thus configured essentially parallel to {111} planes of silicon substrate 1, and are not undercut during the anisotropic etching of silicon substrate 1. Only third edge 273 of first delaying structure 270 is undercut, and forms a first etched edge 223 of a first etching projection region 222. A link 275 of first delaying structure 270 in a first undercut direction 8 is dimensioned such that third edge 273 is situated at a distance, by an etching retardation 221, from first side 261 of base structure 260.

Second retarding structure 240 is fashioned analogously to first retarding structure 220, and is situated at the respectively other ends of first and second transverse edge 211, 212. As second undercut region 530 of test mask 500 can correspond to rotated first undercut region 520, second retarding structure 240 can be obtained by rotating first retarding structure 220 by 180°. In particular, second retarding structure 240 has a further triangular base structure 280 and a second delaying structure 276. As in first retarding structure 220, all edges of second retarding structure 240, with the exception of a longitudinal edge 277 of second delaying structure 276, are situated essentially parallel to {111} planes of silicon substrate 1. Longitudinal edge 277 thus forms a second etched edge 243 of a second etching projection region 242.

Through anisotropic etching, cavity 100 shown in FIG. 1, having the essentially rectangular opening 110, can be etched from silicon substrate 1 using first etching mask 200. Because first and second transverse edge 211, 212, as well as all further edges 215 of mask opening 210, with the exception of third edge 773 of first delaying structure 770 and longitudinal edge 277 of second delaying structure 276, are situated in {111} planes of silicon substrate 1, no undercutting of silicon substrate 1 takes place along these edges. Third edge 273 of first delaying structure 270 is, in contrast, undercut, and forms first etched edge 223. Going out from first etched edge 223, first the first delaying structure 270 is undercut, and then, beginning at first corner 267, triangular base structure 260. Here, the undercutting progresses in first undercutting direction 8, which is oriented approximately parallel to first transverse edge 211 of mask opening 210. Here, a cavity is formed having a progressing edge that is oriented approximately perpendicular to first and second transverse edge 211, 212, and is continuously further displaced in first undercutting direction 8. The anisotropic etching of silicon substrate 1 is stopped as soon as first retarding structure 220 is undercut up to first side 261 of triangular base structure 260 and the progressing edge runs along first side 261 of base structure 260 and forms first longitudinal edge 113 of cavity 100. At the same time, second retarding structure 240, going out from longitudinal edge 277, is undercut in an analogous fashion in a second undercut direction 9 opposite first undercut direction 8, until second longitudinal edge 114 of cavity 100 has formed along a first side 281 of further triangular base structure 280.

Overall, in this way there results the essentially rectangular opening 110 of cavity 100 shown in FIG. 1. The first transverse edge and second transverse edge of opening 110 run along the first transverse edge and the second transverse edge of mask opening 210. First longitudinal edge 113 and second longitudinal edge 114 of opening 110 of cavity 100 are formed along first side 261 of triangular base structure 260 and first side 281 of further triangular base structure 280. Given an ideal homogenous undercutting of first retarding structure 220 and of second retarding structure 240, the anisotropic etching produces a cavity 100 having an opening 110 whose shape comes very close to that of a rectangle. Deviations from an ideal rectangular shape can be caused by, inter alia, a disturbance of the undercutting process. Such disturbances are caused for example by non-homogeneities of the etching mask, or by a deformation or breaking of the etching mask during or after the undercutting. The resulting opening 110 then has regions in which its shape deviates from that of a rectangle.

During the anisotropic etching, cavity 100 is formed through a stepped etching progression that proceeds from first transverse edge 211 in the direction of second transverse edge 212 until the {111} plane running through second transverse edge 112 has been reached. In this plane, there forms further floor surface 117 of cavity 100. As the etching duration increases, an ever-deepening cavity forms until first plane 5 of silicon substrate 1, running in one of the {111} planes, is completely exposed and forms floor surface 115 of cavity 100.

For the complete formation of floor surface 115, it must be ensured that first and second retarding structure 220, 240 are undercut up to first and second longitudinal edge 113, 114 of cavity 100 at the earliest when floor surface 115 of cavity 100 is completely exposed. This is ensured through a suitable selection of etching retardation 221, defined by the length of delaying structures 270, 276 in undercut directions 8, 9. In order to ascertain the etching duration required to form cavity 100, an etching rate in the depth direction (perpendicular to surface 3 of silicon substrate 1) is determined using test etchings. Alternatively, the etching rate in the depth direction can also be calculated from known etching rates in other directions, for example in the crystal directions of substrate 1. The etching duration is then determined from the etching rate in the depth direction and the desired overall depth of cavity 100. The necessary etching retardation 221 then results from the product of the etching duration and a lateral etching rate in undercut directions 8, 9.

In order to avoid premature undercutting of triangular base structure 260 given manufacturing and orientation tolerances, it is advantageous to make first and second base angle 264, 265 each somewhat larger than the angle of intersection of a {111} plane with first side 261 of base structure 260. In this way, second side 262 and third side 263 of base structure 260 are minimally undercut at the beginning of the anisotropic etching, until the {111} planes, running somewhat inside triangular base structure 260, have formed.

Figure 4:
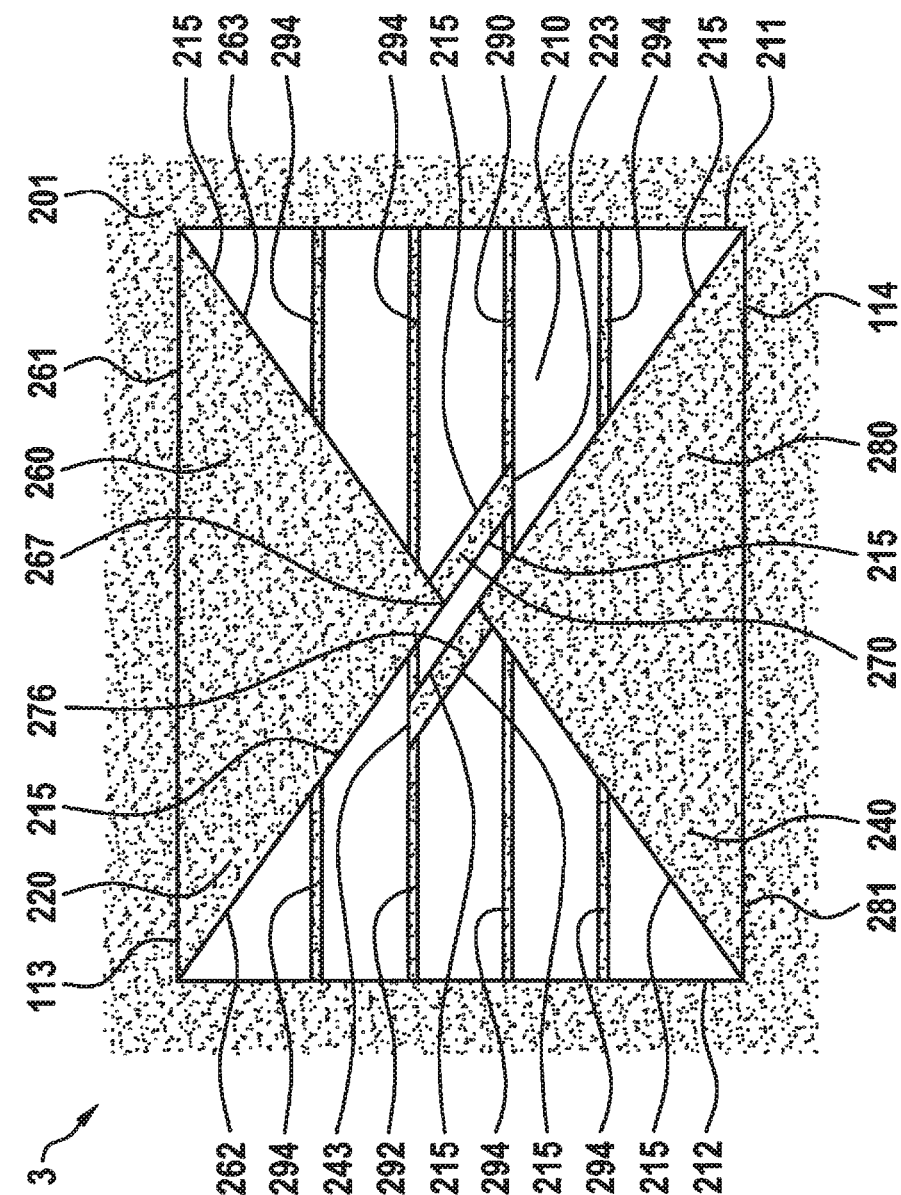
FIG. 4 shows a top view of a second etching mask situated on the silicon substrate.

In FIG. 4, for the formation of cavity 100, instead of first etching mask 200 a second etching mask 201 is situated on silicon substrate 1. Except as otherwise indicated below, second etching mask 201 is identical to first etching mask 200 shown in FIG. 3. Second etching mask 201 has a reinforcing structure 290. Reinforcing structure 290 connects first etched edge 223 to first transverse edge 211, and has edges that are configured perpendicular to first and second transverse edge 211, 212 of mask opening 210. Thus, during the anisotropic etching of silicon substrate 1 these edges are undercut until reinforcing structure 290 stands free. Moreover, first the first delaying structure 270 and then triangular base structure 260 can be undercut as described in connection with FIG. 3.

In addition, second etching mask 201 has a further reinforcing structure 292 that, analogous to reinforcing structure 290, connects second etched edge 243 of second delaying structure 276 to second transverse edge 212 of second etching mask 201, and is also undercut until it stands free. Moreover, second etching mask 201 has additional reinforcing structures 294 for base structures 260, 280. Etching projection regions 222, 242 also include, in second etching mask 201, the edges of reinforcing structures 290, 292, 294.

Reinforcing structures 290, 292, 294 prevent parts of retarding structures 220, 240 from detaching from second etching mask 201 after the undercutting has taken place.

In order to ensure an undercutting of the edges of reinforcing structures 290, 292, 294, these do not have to be situated perpendicular to first and second transverse edge 211, 212 of mask opening 210. It is sufficient if they are not situated in {111} planes of silicon substrate 1. The edges of reinforcing structures 290, 292, 294 also do not have to be all situated in parallel, as shown in FIG. 4. Through a different thickness and inclination relative to transverse edges 211, 212, reinforcing structures 290, 292, 294 can be produced for which a complete undercutting has different durations.

Figure 5:
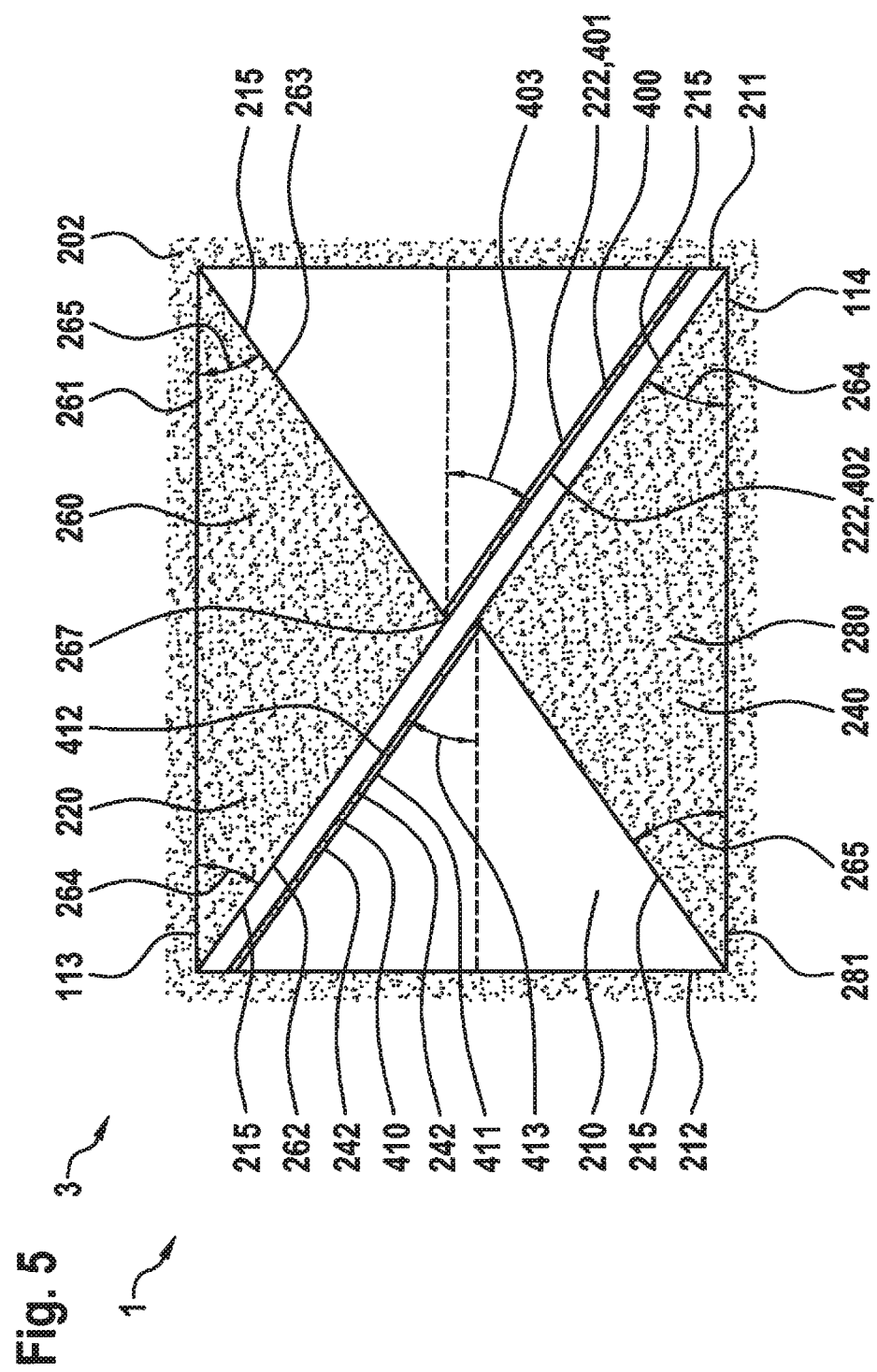
FIG. 5 shows a top view of a third etching mask situated on the silicon substrate.

In FIG. 5, to form cavity 100, instead of first etching mask 200 or second etching mask 201, a third etching mask 202 is situated on silicon substrate 1. Except as otherwise noted below, third etching mask 202 is identical to etching mask 200 shown in FIG. 3. First retarding structure 220 of third etching mask 202 has triangular base structure 260 and a first prolonged delaying structure 400. An end of first prolonged delaying structure 400 is situated at first corner 267 of triangular base structure 260, and the other end of first prolonged delaying structure 400 is situated on first transverse edge 211 of mask opening 210. In this way, a detaching of first prolonged delaying structure 400 from third etching mask 202 is prevented even without reinforcing structures 290, 292, 294 shown in FIG. 4.

In order to enable an undercutting of first prolonged delaying structure 400, a first edge 401 and a second edge 402 of first prolonged delaying structure 400 are not situated in {111} planes of silicon substrate 1. In particular, first base angle 264 and a first tilting angle 403 between first longitudinal edge 113 that is to be formed and first edge 401 of first prolonged delaying structure 400 are not equal in size. In third etching mask 202, first etching projection region 222 is then defined by first edge 401 and second edge 402 of first prolonged delaying structure 400. First edge 401 and second edge 402 do not have to be situated parallel to one another, as shown in FIG. 5. So that an undercutting can take place, at least one of the edges 401, 402 must not be situated along one of the {111} planes of silicon substrate 1.

The time duration required for a complete undercutting of first prolonged delaying structure 400 is determined by first tilting angle 403 and the width of first prolonged delaying structure 400. These have to be selected such that the time required for the overall undercutting of first retarding structure 220 is longer than the time required for the complete exposure of floor surface 115.

For third etching mask 202, second retarding structure 240 has a second prolonged delaying structure 410. Second prolonged delaying structure 410 is fashioned analogously to first prolonged delaying structure 400, and has in particular a second tilting angle 413. First tilting angle 400 and second tilting angle 413 can be identical. Second etching projection region 242 is formed by a first edge 411 and a second edge 412 of second prolonged delaying structure 410.

Figure 6:
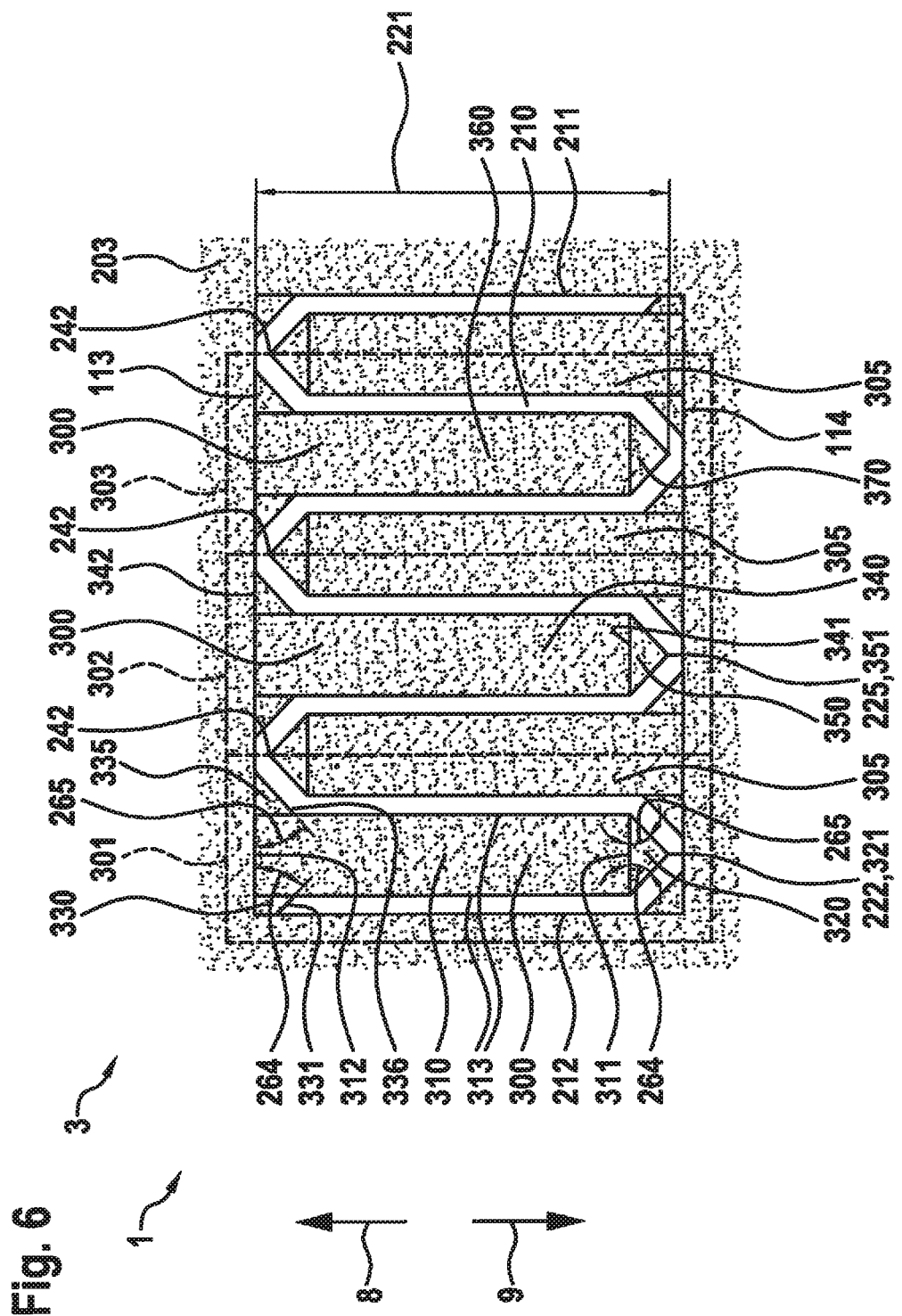
FIG. 6 shows a top view of a fourth etching mask situated on the silicon substrate.

In FIG. 6, for the formation of cavity 100, instead of first, second, or third etching mask 200, 201, 202, a fourth etching mask 203 is situated on silicon substrate 1. Except as otherwise described below, this mask is identical to etching masks 200, 201, 202 shown in FIGS. 3 through 5.

A first retarding structure 300 of fourth etching mask 203 has a first segment 301, a second segment 302, and a third segment 303. First segment 301 includes a first oblong region 310, a first pointed region 320, as well as a first base triangle 330 and a second base triangle 335.

First oblong region 310 has two side edges 313. Side edges 313 are situated parallel to transverse edges 211, 212 of mask opening 210. First oblong region 310 can for example be made rectangular, and first base triangle 306 and second base triangle 307 can for example be made as right triangles. First pointed region 320 is situated on a first side 311 of first oblong region 310. First longitudinal edge 113 of the cavity is fashioned on an oppositely situated second side 312 of first oblong region 310. Base triangles 330, 335 are situated such that respectively one of their sides prolongs second side 312 of first oblong region 310, and a further side is respectively adjacent to one of the side edges 313 of first oblong region 310.

All sides of fourth etching mask 203 inside first segment 301 are essentially situated in {111} planes of silicon substrate 1. In particular, first pointed region 320, fashioned as a triangle, has, analogously to triangular base structure 260 of first etching mask 200, first base angle 264 and second base angle 265 on first side 311 of first oblong region 310. Here, first pointed region 320 is a triangle similar to triangular base structure 260 of first, second, and third etching mask 200, 201, 202. Likewise, a first base edge 331 of first base triangle 330 spans the first base angle 264 with first longitudinal edge 113 of cavity 100, later to be formed, and a second base edge 336 of second base triangle 335 spans second base angle 265 with first longitudinal edge 113.

In the anisotropic etching, no undercutting takes place at all edges of first segment 301. Only a first point 321 of first pointed region 320 fashioned as a triangle acts as first etching projection region 222. Going out from there, first the first pointed region 320 and subsequently first oblong region 322 is undercut in undercut direction 8.

In second segment 302 and in third segment 303, first retarding structure 300 of fourth etching mask 203 is formed analogously to first segment 301, and in each case has a second oblong region 340, or third oblong region 360, and a second pointed region 350, or third pointed region 370. Second pointed region 350 is situated on a first side 341 of second oblong region 340, while first longitudinal edge 113 is fashioned on a second side 342 of second oblong region 340. In second segment 302, first retarding structure 300 of fourth etching mask 203 is undercut analogously to first segment 301 in first undercut direction 8. A second point 351 of second pointed region 350 forms a third etching projection region 225. Going out from second point 351, first the second pointed region 350, and then second oblong region 340, is undercut in first undercut direction 8. Analogously, in third segment 303, first the third pointed region 370 and then third oblong region 360 are undercut in first undercut direction 8. The undercutting of the first, second, and third segment 301, 302, 303 here takes place approximately simultaneously, so that the first longitudinal edge 113 is formed after the elapsing of the etching duration. Here, the etching duration required for the complete formation of first longitudinal edge 113 can be controlled via the size of etching retardation 221, as described in connection with FIG. 3. In fourth etching mask 203, etching retardation 221 can be adapted via the length of first, second, and third oblong region 310, 340, 360 in first undercut direction 8.

Because segments 301, 302, 303 of first retarding structure 300 of fourth etching mask 203 are each undercut independently of each other, disturbances in the etching process in one of the segments 301, 302, 303, which can be caused for example by detaching parts of fourth etching mask 203, have an effect on the waviness of first longitudinal edge 113 only in the part thereof adjoining the respective region. Thus, overall a low degree of residual waviness of first longitudinal edge 113 can be achieved. In this way, a cavity 100 can be produced whose opening 110 has an approximation that is as good as possible to an ideal rectangular shape. Fourth etching mask 203 can also have fewer or more than the depicted three segments 301, 302, 303. For a given length of first longitudinal edge 113, the width of oblong regions 310, 340, 360 is then to be adapted such that the overall first longitudinal edge is covered by first retarding structure 300 of fourth etching mask 203. The residual waviness of first longitudinal edge 113 can be less the more narrow oblong regions 310, 340, 360 are made. Correspondingly, narrow oblong regions 310, 340, 360 make it possible to produce a cavity 100 having an opening 110 that comes particularly close to the ideal rectangular shape.

To form second longitudinal edge 114, a second retarding structure 305 is situated opposite fourth etching mask 203 of first retarding structure 300 of fourth etching mask 203. Here, second retarding structure 305 of fourth etching mask 203 is, analogous to first retarding structure 300 of fourth etching mask 203, divided into a plurality of segments each having a pointed region, an oblong region, and two base triangles. The oblong regions of first and second retarding structure 300, 305 of fourth etching mask 203 are situated offset to one another transverse to transverse edges 211, 212, so that segments 301, 302, 303 of first retarding structure 300 of fourth etching mask 203 are made so as to mesh with the segments of second retarding structure 305 of fourth etching mask 203. Second retarding structure 305 of fourth etching mask 203 can be produced by rotating first retarding structure 300 of fourth etching mask 203 by 180°.

The base triangles, such as first and second base triangle 330, 335, prevent the region of fourth etching mask 203 situated at first and second longitudinal edge 113, 114 from being prematurely undercut. This is achieved in that the base edges of the base triangles, such as the first and the second base edge 331, 336, are situated in {111} planes of silicon substrate 1. The base triangles of fourth etching mask 203 shown in FIG. 6 do not adjoin one another. In this way, for example the mask edge situated between second base triangle 335 and the oppositely situated base triangle of second segment 302 is undercut until the {111} plane running along second base edge 336 of second base triangle 335, and the {111} plane running along the corresponding edge of the adjacent base triangle of second segment 302 are each exposed up to their common line of intersection. There then takes place no further undercutting until the rest of first retarding structure 300 of fourth etching mask 203 is undercut up to the common line of intersection. Overall, there thus results a longitudinal edge that, relative to first longitudinal edge 113, shown in FIG. 6, is set back from mask opening 210 in first undercut direction 8.

Figure 7:
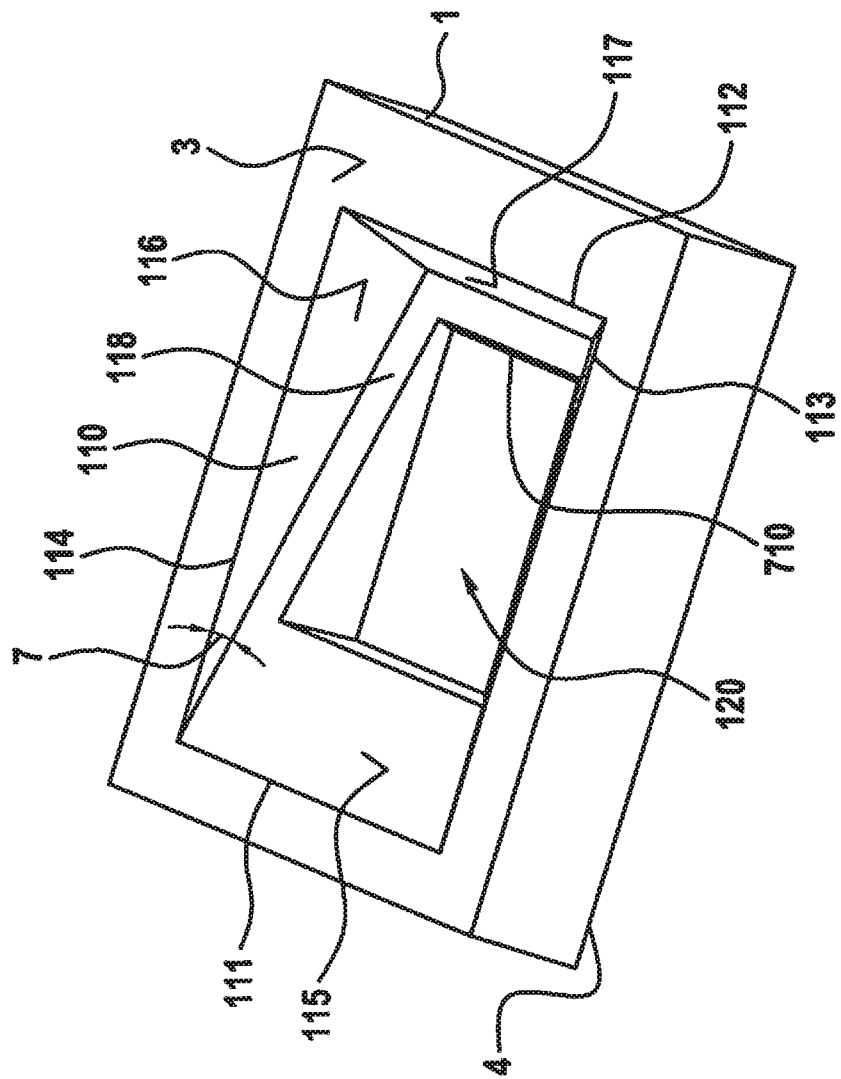
FIG. 7 shows a top view of the component having a cavity, having a through-opening.

FIG. 7 shows a schematic representation of component 700 that includes a silicon substrate 1 having cavity 100 formed therein.

In addition to cavity 100, in the specific embodiment of FIG. 7 silicon substrate 1 of component 700 has a through-opening 120 that is situated between floor surface 115 and a rear side 4 of silicon substrate 1 situated opposite surface 3. Through-opening 120 produces a gap 710 in floor surface 115 of cavity 100. Gap 710 is situated approximately in the center of floor surface 115. Floor surface 115 is only partly removed by 710, so that an edge surface 118 formed from floor surface 115 remains around gap 710.

Component 700 can for example be used as a bearer for an optical element, for example a planar optical element such as a mirror, a window, a filter, or an optical grid. Here, the optical element can lie on edge surface 118. Through-opening 120 enables an optical access to the optical element from rear side 4 of silicon substrate 1. Floor surface 115 of cavity 100, inclined by tilting angle 7, enables an inclined situation of the optical element relative to surface 3 of silicon substrate 1. If component 700 is made without through-opening 120, then an element can be situated in cavity 100 that does not have to be accessible from both sides, such as a mirror or an optical grid. Component 700 can also itself be used as an optical element for suitable spectral regions, for example as a prism for electromagnetic radiation in the infrared range.

Figure 8:
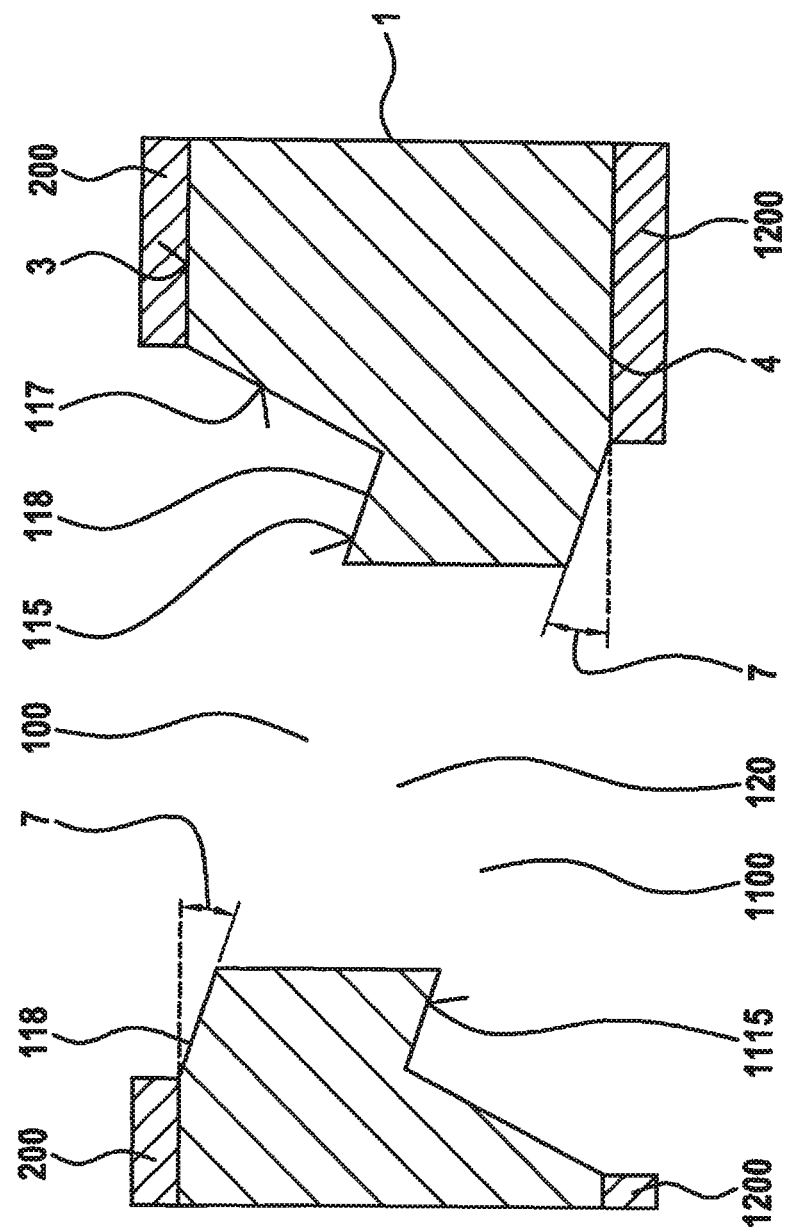
FIG. 8 shows a sectional view of the silicon substrate having the cavity, a further cavity, and the through-opening.

FIG. 8 shows a schematic sectional view of a further specific embodiment of component 700, and of etching mask 200 situated on surface 3 of silicon substrate 1. The depicted specific embodiment is identical to the specific embodiment of FIG. 7, except for differences indicated in the following description. Component 700 has a further cavity 1100 on rear side 4 of the silicon substrate. This further cavity is formed using a further etching mask 1200 in accordance with the method described in connection with FIGS. 1 through 6. A floor surface 1115 of further cavity 1100 is formed, as is floor surface 115, by an exposed {111} plane of silicon substrate 1. Here, floor surface 115 of cavity 100 and floor surface of 1115 of further cavity 1100 are situated parallel to one another, and enclose a thin membrane. The thickness of this membrane can be influenced by a lateral offset of etching mask 200 and of further etching mask 1200 in a direction perpendicular to first transverse edge 211 and second transverse edge 212. As also in cavity 100, a further optical element can be attached in cavity 115. The further optical element can be situated on floor surface 1115 of further cavity 1100. Component 700 can be equipped with optical elements on one side in one of the cavities 100, 1100, or also on both sides, so that an optical element is situated both in cavity 100 and also in further cavity 1100.

Instead of first etching mask 200, second, third, or fourth etching mask 201, 202, 203 can also be used. Further etching mask 1200 is fashioned in the same manner as first, second, third, or fourth etching mask 200.

Through-opening 120 is fashioned as described in connection with FIGS. 6 and 7, and extends between floor surface 115 of cavity 100 and floor surface of 1115 of further cavity 1100.

Through-opening 120 can for example be produced by a directed etching process, for example by reactive ion deep etching. For this purpose, a further one-sided etching mask, that can for example have a lacquer, can be applied on silicon substrate 1 with cavity 100. The etching mask is opened corresponding to through-opening 120.

Figure 9:
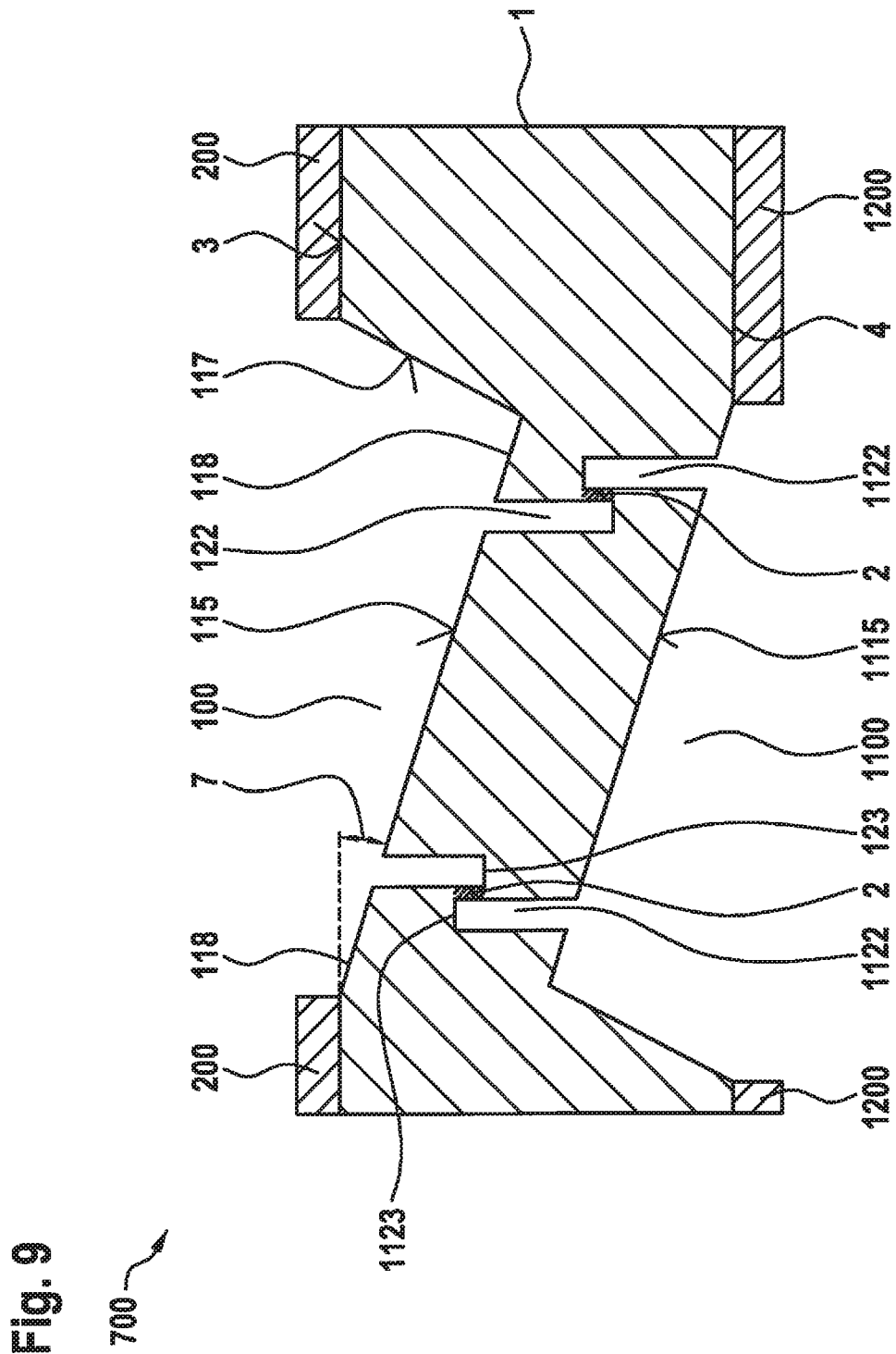
FIG. 9 shows a sectional view of the silicon substrate having the cavity, the further cavity, and a first and second trench.

Alternatively, through-opening 120 can be fashioned using a method as shown in the schematic sectional representation of FIG. 9. FIG. 9 shows a schematic sectional representation of the specific embodiment shown in FIG. 8 of component 700 before the formation of through-opening 120.

In floor surface 115 of cavity 100 there is fashioned a first trench 122 that extends into silicon substrate 1 in the direction of further cavity 1115. Here, trench 122 does not break through floor surface 1115 of further cavity 1100. First trench 122 can for example be made in a closed annular shape, and can run along the contour of through-opening 120, which is still to be formed. First trench 122 can for example be produced using a directed etching process described in connection with FIG. 8.

From rear side 4 of silicon substrate 1, for example also using a directed etching process, a second trench 1122 is fashioned that does not break through floor surface 115 of cavity 100. This trench can be formed on the rear side 4 of silicon substrate 1, or, if, as shown, silicon substrate 1 has further cavity 1100, in floor surface 1115 of this cavity. Further trench 1122 extends into silicon substrate 1 in the direction of floor surface 115 of cavity 100. Second trench 1122 is offset relative to first trench 122. For example, it can be offset outwardly or inwardly relative to through-opening 120 to be formed.

First trench 122 and second trench 1122 are each made so deep that a floor 1123 of second trench 1122 is situated closer to floor surface 115 of cavity 100 than a floor 123 of first trench 122. Through-opening 120 can then be produced by etching away a part 2 of silicon substrate 1 that is situated between first trench 122 and second trench 1122. For this purpose, for example an anisotropic etching process can be used, such as a brief immersion in a KOH solution.

Figure 10:
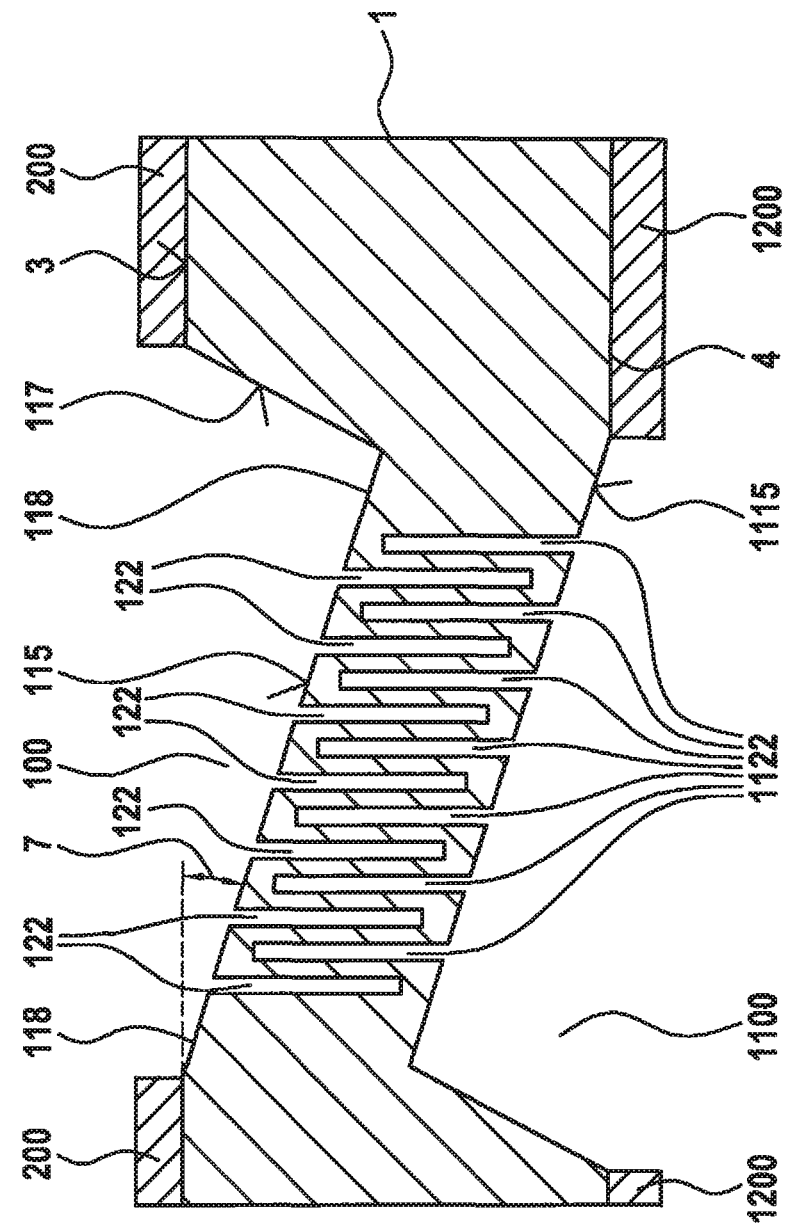
FIG. 10 shows a sectional view of the silicon substrate having the cavity, the further cavity, a first and second trench, and further trenches.

FIG. 10 shows a schematic representation of a further method for forming a through-opening 120, shown in FIG. 8, in silicon substrate 1 of component 700. Silicon substrate 1 here has a plurality of first trenches 122 and second trench is 1122 that are formed as described in connection with FIG. 9. Trenches 122 and 1122 can for example be made linear, or can have concentric annular contours, or a regular square raster. Through-opening 120 can in turn be formed after the formation of trenches 122, 1122, using an anisotropic etching process in which the substrate material between trenches 122, 1122 is removed.

Figure 11:
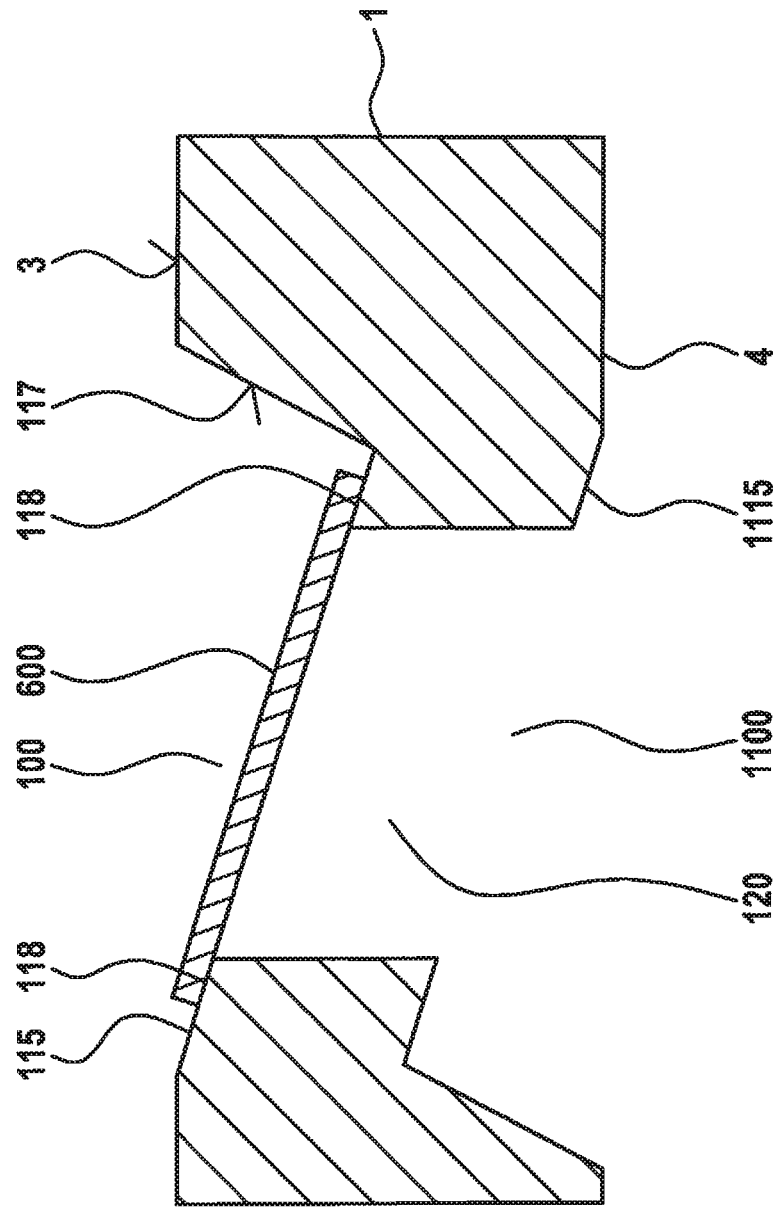
FIG. 11 shows a sectional representation of the component having the cavity and a small window plate set into the cavity.

FIG. 11 shows a schematic representation of the specific embodiment shown in FIGS. 8 through 10 of component 700 after the removal of etching mask 200 and of further etching mask 1200. A small window plate 500 is situated in cavity 100. This plate is placed on floor surface 115 of cavity 100. The window plate here lies on an edge surface 118, which surrounds through-opening 120. Window plate 600 can for example lie flat on an edge surface 118. Here, window plate 600 can cover through-opening 120 partially or completely. Window plate 600 can for example be fastened on silicon substrate 1 by a bonding process. In this case, a window plate 600 that completely covers through-opening 120 and is fastened by a bonding agent going around through-opening 120 can seal through-opening 120 in airtight fashion.

What is claimed is:

1. A method for forming a cavity in a silicon substrate, comprising:
    providing the silicon substrate, a surface of the silicon substrate having a tilting angle relative to a first plane of the silicon substrate, and the first plane being a {111} plane of the silicon substrate;
    situating an etching mask on the surface of the silicon substrate, the etching mask having a mask opening having a first transverse edge and a second transverse edge parallel to the first transverse edge, the first transverse edge being situated in the first plane of the silicon substrate, the etching mask having a first retarding structure that protrudes into the mask opening, the etching mask having a first etching projection region, and all further edges of the mask opening outside the first etching projection region being situated parallel to {111} planes of the silicon substrate; and
    anisotropically etching the silicon substrate during a defined etching duration, an etching rate in the <111> directions of the silicon substrate being lower than in other spatial directions, the first retarding structure being undercut going out from the first etching projection region in a first undercut direction, the first undercut direction being oriented parallel to the first transverse edge and the second transverse edge of the mask opening, the etching duration being defined such that through the anisotropic etching, a cavity forms in the silicon substrate hat has an opening on the surface of the silicon substrate, the opening of the cavity being limited at two sides by the first transverse edge and the second transverse edge of the mask opening, and at a further side by a first longitudinal edge, perpendicular to the first and to the second transverse edge, that is produced by the undercutting of the first retarding structure, and the etching duration moreover being defined such that after elapsing of the etching duration, the first plane of the silicon substrate is exposed and forms a floor surface of the cavity.

2. The method as recited in claim 1, wherein the etching mask has a second retarding structure that protrudes into the mask opening, the etching mask having a second etching projection region, the second retarding structure being undercut by the anisotropic etching of the silicon substrate, going out from the second etching projection region, in a second undercut direction opposite the first undercut direction, in such a way that after the elapsing of the etching duration a second longitudinal edge limiting the opening of the cavity is formed that is situated parallel to the first longitudinal edge.

3. The method as recited in claim 1, wherein the first etching projection region has an etched edge that is not situated parallel to a {111} plane of the silicon substrate.

4. The method as recited in claim 1, wherein the first retarding structure has a triangular base structure, the first longitudinal edge being fashioned at a first side of the triangular base structure, and a second side and a third side of the triangular base structure being situated parallel to {111} planes of the silicon substrate.

5. The method as recited in claim 4, wherein the first retarding structure has a first delaying structure that is situated at a first corner, situated opposite the first side, of the triangular base structure.

6. The method as recited in claim 5, wherein the first delaying structure connects the first corner of the triangular base structure to at least one of the first transverse edge and the second transverse edge.

7. The method as recited in claim 1, wherein the etching mask has at least one reinforcing structure that connects the first retarding structure to at least one of the first transverse edge and the second transverse edge.

8. The method as recited in claim 1, wherein the etching mask has a third etching projection region, the first retarding structure being undercut, going out from the first etching projection region and the third etching projection region, in such a way that, upon elapsing of the etching duration, the first longitudinal edge, limiting the opening of the cavity, is formed.

9. The method as recited in claim 8, wherein the first retarding structure has a first segment having a first oblong region and a first pointed region, and having a second segment having a second oblong region and a second pointed region, a first point of the first pointed region forming the first etching projection region, and a second point of the second pointed region forming the third etching projection region, a first side of the first oblong region being situated at the first pointed region and a first side of the second oblong region being situated at the second pointed region, and the first longitudinal edge being fashioned at a second side of the first oblong region and at a second side of the second oblong region.

10. The method as recited in claim 1, further comprising:
creating a through-opening between the floor surface of the cavity and a rear side, situated opposite the surface, of the silicon substrate.

11. The method as recited in claim 10, further comprising:
forming a further cavity on the rear side of the silicon substrate, the through-opening being placed between the floor surface of the cavity and a floor surface of the further cavity.

12. The method as recited in claim 11, wherein the creating of the through-opening includes:
forming a first trench that extends from the floor surface of the cavity into the silicon substrate in the direction of the further cavity;
forming a second trench that extends from the floor surface of the further cavity into the silicon substrate in the direction of the cavity; and
separating a part of the silicon substrate that is situated between the first trench and the second trench.

13. The method as recited in claim 12, further comprising:
situating a small window plate in the cavity in such a way that the small window plate covers the through-opening and lies on an edge surface, situated in the floor surface of the cavity, that surrounds the through-opening.

* * * * *